ELECTRICAL TUNING DEVICE

Filed Oct. 15, 1952

INVENTOR.
DAVID C. FELT
BY Darby & Darby
ATTORNEYS

United States Patent Office 2,807,724
Patented Sept. 24, 1957

2,807,724

ELECTRICAL TUNING DEVICE

David C. Felt, Teaneck, N. J., assignor to Allen B. Du Mont Laboratories, Inc., Clifton, N. J., a corporation of Delaware Application October 15, 1952, Serial No. 314,851

7 Claims. (Cl. 250—40)

The present invention relates to electrical tuning devices and particularly to a novel construction for selectively converting radio signals of any one of a plurality of frequencies to a standard intermediate frequency.

More particularly still the invention relates to a tuning device of the type described adjustable to tune a wide range of frequencies including the frequencies of all of the 82 presently allocated television channels.

Electrical tuning devices of the general type above described have been constructed, but these devices were limited to the tuning of a small number of frequencies and were not adapted to have their range extended without becoming electrically inefficient and physically so increased in size as to be substantially unusable.

In the copending application of Clifford D. Nestlerode and David C. Felt, Serial No. 314,188 there is disclosed a tuning device which overcomes many of the difficulties above-mentioned. This device, however, comprises a pair of drums and is not adapted for use in many situations where a flat structure is preferable. Moreover, the drum structure makes it difficult to form various of the circuit elements through the printed or stamped wiring techniques. My present invention overcomes the defects of both the older types of electrical tuning devices and of that of the copending application.

The preferred embodiment of the invention comprises two insulative flat disks or plates positioned closely together on a common axis, the disks being rotatable. One of the disks, referred to hereinafter as a "circuit disk" has a plurality of sets of circuits or coils fastened thereto, the coils in each set being positioned radially on the surface of the disk. Suitable terminal connector pins extend through the disk and are connected at one end thereof to the coils. An electric circuit unit is suitably positioned with respect to the circuit disk, and fixed contact members are provided thereon, so that when the circuit disk is rotated by means provided for that purpose the various sets of radially positioned coils are selectively engaged, through the respective connector pins, with the fixed contacts on the electric circuit unit.

The other disk, which will be referred to hereinafter as a "tuning disk" has provided on the surface thereof a plurality of electrically conductive fine tuning or shading elements. The insulative disks provide plane surfaces and are therefore admirably adapted to the use of the printing and stamping of circuits thereon. This both reduces the cost of manufacture of the device and additionally makes it possible to have the frequency determining and shading elements operate closely adjacent to each other and thereby increases the electrical efficiency of the device. Means are provided for rotating the tuning disk with the circuit disk and for rotating or oscillating the tuning disk with respect to the circuit disk, so that the resonant frequency of the coils on the circuit disk may be changed as the tuning disk is rotated.

The rim of the circuit disk is provided with suitable scale indicia, separate indicia being provided for each set of radially positioned coils, and the tuning disk is provided with a plurality of indicators, or pointers, which protrude from the rim thereof and extend over the surfaces of the respective circuit disk indicia. When the tuning disk is rotated, the indicators move over their respective indicia scales. Thus, coarse tuning is accomplished by rotating the circuit disk so as to selectively switch various sets of coils into contact with the electric circuit unit, the corresponding scale and pointer appearing in a window and continuous vernier tuning, over each range of coarse tuning, is accomplished by oscillating the tuning disk, the corresponding pointer then moving over its scale to indicate the position of the tuning disk.

It is an object of the invention to provide an electrical tuning device which is physically compact and which is shallow so that it may be, for example, mounted in a television cabinet beneath the cathode ray tube and need not be mounted to the side thereof or otherwise cause an appreciable increase in the over-all size of the television receiver cabinet.

It is another object of the invention to provide such a tuning device, the structure of which readily adapts it to the use of circuit elements which are printed or stamped.

It is a still further object of the invention to provide an electrical tuning unit which, without extreme increase in bulk, is capable of tuning a wide range of frequencies including the frequencies of all of the 82 presently allocated television channels.

Other objects and features of the invention will be apparent when the following description is considered in connection with the annexed drawings, in which, Figure 1 is a front view of a television receiver which embodies the invention;

Figure 2:
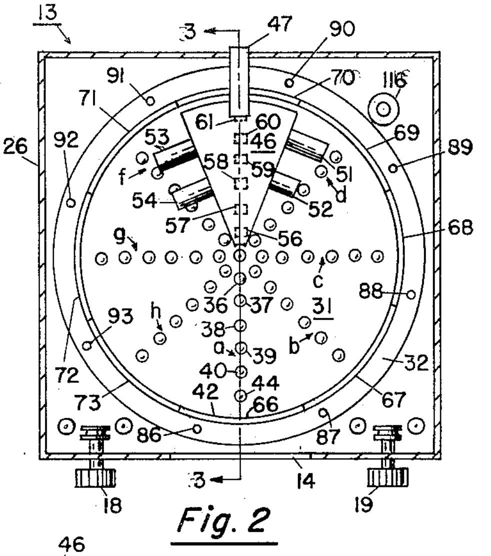
Figure 2 is a top plan view of a tuner, constructed in accordance with the invention, with its shielding cover removed.
Figure 3:
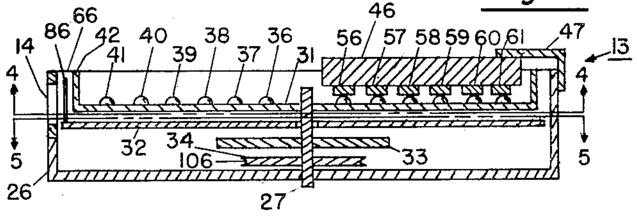
Figure 3 is a cross-sectional view of the device of Figure 2 the view being taken on the plane of the line 3—3 of Figure 2.
Figure 4:
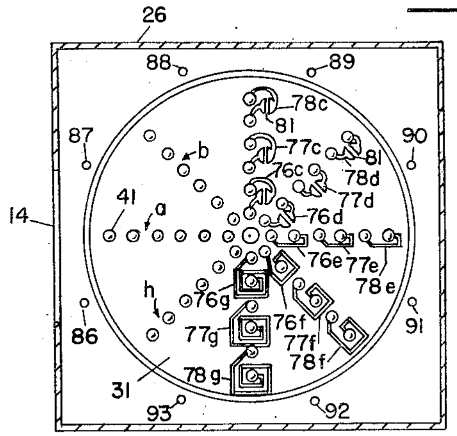
Figure 5:
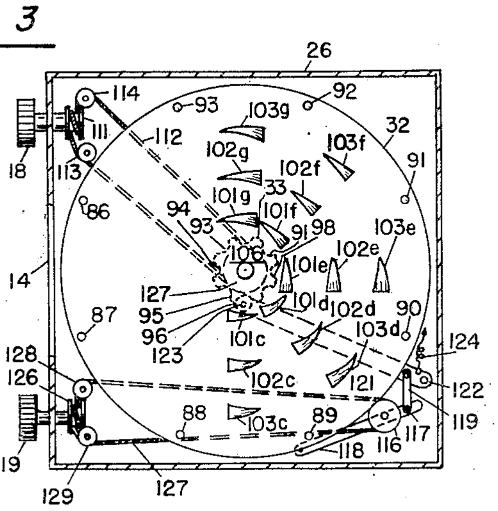

Figure 4 is a cross-sectional view of the device of Figure 2, the view being taken on the plane of the line 4—4 of Figure 3. This view shows a preferred arrangement of coils on the underside of the circuit disk; and Figure 5 is a cross-sectional view of the device of Figure 2 the view being taken on the plane of the line 5—5 of Figure 3 and shows a preferred arrangement of tuning elements on the upper side of the tuning disk. Figure 5 also shows a preferred mechanism for rotating the circuit disk and tuning disk.

Figure 1:
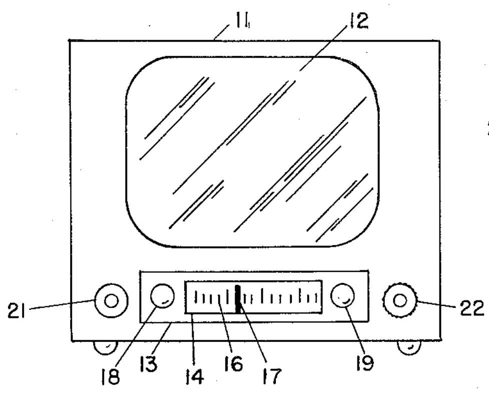

Referring now to the drawings and particularly to Figure 1, there is shown a cabinet 11 in which a television picture tube 12 is mounted. A tuner 13, in accordance with the present invention, is positioned below the picture tube 12. Alternatively, the tuner 13 may be positioned above or beside the picture tube 12.

An opening 14 is provided in the tuner 13, through which an indicia scale 16 and a cooperating indicator or pointer 17 are visible. A coil switching knob 18 and a vernier tuning knob 19 are provided. Other knobs 21 and 22 are provided on the television receiver for accomplishing various other adjustments such as volume, brightness, contrast, and the like.

The tuning device 13 comprises a housing 26 having a generally flat, square shape. A spindle 27 is rotatively positioned in the approximate center of the bottom portion of the housing 26. A circuit disk 31 is rigidly secured at its center to one end of the spindle 27. A tuning disk 32 is rotatively positioned at the center thereof on the spindle 27 below and closely adjacent to the circuit disk 31. A control disk 33 is fixedly positioned on the spindle 27 below the tuning disk 32. A pulley 34 is rigidly affixed to the spindle 27 at a point between the control disk 33 and the bottom of the housing 26. The circuit disk 31, control disk 33, pulley 34, and spindle 27 are rotatable in unison, whereas the tuning disk 32 is independently rotatable.

A plurality of sets of contact pins extend through the circuit disk 31 and are arranged so that the pins of each set extend in a substantially radial line of the circuit disk. The sets of contact pins are preferably equally spaced apart angularly. In the preferred embodiment shown in the drawing, there are provided eight sets of connector pins, each set comprising six pins arranged radially the radial lines extending at angles of 45° to each other. The sets of pins are designated by the letters *a* through *h*. The six pins in each set are designated by the numerals 36 through 41. Eeight sets of electrical coils, with three coils per set, are connected to the connector pins as will be described hereinafter.

An annular rim 42 extends upwardly from the outer edge of the circuit disk 31. An electrical circuit unit 46 is positioned, by means of a bracket 47, substantially within the confines of the rim 42. The circuit unit 46 may have electronic tubes, transformers, or transistors or the like 51, 52, 53, 54 extending from the sides thereof. Stationary contacts 56 through 61 extend downwardly from the circuit unit 46 so as to make selective engagement with the sets of radially positioned contact pins when the circuit disk is rotated. The electric circuits of unit 46 preferably comprise a tuned radio frequency circuit, an oscillator circuit, and a mixer circuit of the types normally used in television or radio receivers. The coils on the coil disk provide tuning elements for the electric circuits.

Since eight sets of coils are contemplated in the preferred embodiment, eight indicia scales 66 through 73 are arranged in equal segments on the outer periphery of the rim 42. The visible indicia 16 shown in Figure 1 corresponds to any one of these latter named indicia segments. The indicia scales may be calibrated in frequency or in television channels, or the like.

The underside of the circuit disk 31 preferably is provided with printed coils or frequency determining elements as is illustrated in Figure 4 of the drawing. The "*g*" set of coils comprises three coils 76*g*, 77*g*, and 78*g*. The ends of these printed coils are connected respectively to the terminal pins 36*g* through 41*g*. These coils are shown as comprising more than one turn. The "*f*" coils are shown as comprising one turn each. The "*e*" coils are shown as comprising less than one turn each. The three sets of coils just described are particularly suitable for use in tuning the V. H. F. television bands.

The "*c*" and "*d*" coils shown in Figure 4 are particularly suitable for tuning the U. H. F. frequencies. As is shown in Figure 4, these coils are provided with slits 81 so as to provide a capacitance between the slit sections thereof to provide what is known as a series-tuned circuit. The "*c*" coils are shown as being slit in a radial manner whereas the "*d*" coils are shown as being slit laterally. The portions of the coils adjacent the slits 81 are widened as shown in order to provide capacitive areas which cooperate with shading elements on the tuning disk to be described hereinafter.

The various types of coils and capacitances, just described, may be referred to generically as frequency-determining elements. The remaining frequency-determining elements *a* and *b* are not shown, but may be of any desired configuration.

For convenience, if desired, the radial rows of connector pins 36 through 41 may be staggered instead of arranged in straight lines as shown. The stationary contacts 56 through 61 should, of course, be staggered in a corresponding manner so as to properly engage the various sets of connector pins. Staggering of the connector pins will provide a greater insulative space between pins, and may permit the use of more pins, or a smaller diameter circuit disk, or modified coil arrangements.

The tuning disk 32 preferably has a larger diameter than the circuit disk 31. Eight indicators or pointers 86 through 93 are attached to the tuning disk near the periphery thereof, and extend upwardly and in front of the outer surface of the rim 42 of the circuit disk 31. The pointers are spaced at equal angular distances. Each pointer corresponds to one of the indicia segments 66—73. The visible pointer 17 shown in Figure 1 corresponds to any one of the pointers 86—93.

Tuning elements, of electrically conductive material, are provided on the upper surface of the tuning disk 32, preferably as shown in Figure 5. The representative tuning elements shown are arranged in sets designated by the letters *c* through *g*, which correspond with the sets of coils and connector pins described above. Each set of tuning elements comprises three wedge-shaped conductive members 101, 102, and 103, which preferably are placed on the upper surface of the tuning disk 32. The wedge-shaped tuning elements may have differing tapers, to accomplish tracking.

The tuning elements are so positioned and arranged as to affect the tuning of the corresponding sets of coils when the tuning disk is rotated through a limited angle with respect to the circuit disk 31. In the embodiment shown, the tuning disk may be rotated through ⅛ of a revolution with respect to the circuit disk. The tuning elements affect the tuning of the coils because of the close proximity of the tuning elements to the coils. When the tuning or shading elements are moved, the resonance frequencies of the coils are changed due to the effect of the tapered shapes of these elements on the capacitances and the inductances of the coils.

The control disk 33 has a cam surface, which may comprise a plurality of detents 91—98 on the periphery thereof, corresponding to the number of coil sets. The pulley 34 has an annular groove 106 on the rim thereof.

Independent means are provided to rotate the circuit disk and the tuning disk. In the embodiment shown, the coarse tuning knob 18 is connected to actuate a drive pulley 111. A drive belt 112 is positioned around the pulley 111, around idler wheels 113 and 114, and around the groove 106 in the pulley 34. When the coarse tuning knob 18 is turned, the circuit disk 31 and control disk 33 rotate as a unit. The tuning disk 32 also rotates, due to frictional engagement with the spindle 27.

To accomplish vernier tuning, a vernier drive wheel 116 is positioned near the rim of the tuning disk 32, and is mounted on an arm 117 which is pivoted at an end 118 thereof. A link 119 is connected between the arm 117 and a lever 121, which is pivoted at an end 122 thereof. A projection 123 is provided at the remaining end of the lever 121 and is positioned to bear against the rim of the detent disk 33. A spring 124 urges the projection 123 into contact with the rim of the detent disk 33 and at the same time, urges the vernier drive wheel 116 toward the rim of the tuning disk 32. The vernier tuning knob 19 has a drive pulley 126 connected thereto, and a drive belt 127 engages the drive pulley 126, the vernier drive pulley 116, and idler wheels 128 and 129.

When the circuit disk 31 is rotated so that a set of coils is switched into position to make contact with the electrical circuit unit 46, the projection 123 of the lever 121 engages one of the detents 91—98 on the detent disc 33. These detents are sufficiently deep so that the projection 123 does not reach the bottom thereof, thereby allowing the vernier drive wheel 116 to engage the rim of the tuning disk 32 so that the tuning disk 32 may be rotated when the vernier knob 19 is turned. Alternatively, lost motion may be provided in the connections of the link 119 to insure that the drive wheel 116 will engage the tuning disk when the projection 123 is engaged in a detent. The end pivot connection holes of the link 116 may be enlarged to provide lost motion. The drive belt 127 may be of elastic material so as to urge the vernier drive wheel 116 towards the rim of the tuning disk 32.

When the circuit disk 31 is rotated by means of the coarse tuning knob 18, the detent disk 33 forces the projection 123 out of a detent, thereby moving the vernier drive wheel 116 out of contact with the tuning disk 32, through action of the link connection 119. Whenever a set of coils is in proper position to be connected at the electrical circuit unit 46, the projection 123 engages a detent in the detent disk 33, thereby automatically engaging the vernier drive wheel with the tuning disk 32. Thus, when the coarse tuning knob is turned, thereby switching various sets of coils into contact with the circuit unit 46, the indicia scales rotate past the opening 14 and, also, the pointer members 86—93 rotate along with the corresponding indicia scales 66—73.

When the vernier tuning knob 19 is turned, the circuit disk remains fixed in position and the tuning disk alone moves with respect to the circuit disk.

Although the preferred embodiment described above employs as many sets of tuning elements as there are sets of coils, it is possible to employ a single set of tuning elements, on the tuning disk 32 in the vicinity of the stationary contacts 56—61, to selectively vernierly tune the various sets of coils when they are switched into electrical contact with the circuits 46. With a single set of tuning elements, only a single indicator is required, and the tuning disk 32 need be rotated over only a limited angle with respect to the housing 26 instead of being rotated along with the circuit disk when the latter is rotated to switch different sets of coils into the electrical circuits. However, the multiple-set tuning elements are preferable since each set can be tailored to properly affect the tuning of its corresponding set of coils.

Instead of depending upon friction between the spindle 27 or the control disk 33 and the tuning disk 32 to cause rotation of the tuning disk 32 with the frequency determining disk 31, a positive means may be provided for assuring that the sets of tuning elements remain properly phased with respect to the cooperating frequency determining elements. Such means may, for example, comprise a projection extending upwardly from the disk 32 and into a slot in the disk 31 so that the amount of relative rotation of the two disks is limited thereby assuring that during rotation of the frequency determining elements the tuning elements are similarly rotated to permit independent rotation of the tuning disk while the frequency determining or circuit disk is stationary.

While preferred embodiments of the invention have been shown and described, various modifications thereof will be apparent to those skilled in the art and will fall within the scope of the invention. The scope of invention is defined in the following claims:

What is claimed is:

1. A high frequency electrical tuning device comprising a pair of insulative disks positioned in closely spaced parallelism on a common axis, means for selectively rotating said disks, a plurality of frequency determining elements spirally wound in a single plane on one of said disks and a plurality of substantially triangular, flat, electrically conductive tuning elements on the other of said disks corresponding to respective ones of said frequency determining elements and adapted to modify the tuning thereof when said other disk is rotated.

2. In a high frequency electrical tuning device, in combination, a housing, a shaft rotatably mounted in said housing, a circuit disk fixed on said shaft for rotation therewith, a plurality of sets of frequency determining elements spirally wound in a single plane mounted on one surface of said disk, the elements of each set being spaced along a radial line of said disk, said sets of elements being angularly spaced apart, a tuning disk mounted on said shaft for rotation independently thereof, one surface of said tuning disk being spaced slightly from the surface of said circuit disk bearing said frequency determining elements, a plurality of sets of substantially triangular, flat, tuning elements mounted on the face of said tuning disk adjacent said frequency determining elements, said sets of tuning elements corresponding in arrangement to said sets of frequency determining elements, both as respects the angular arrangement of the sets and the radial arrangement of the elements of each set, a stationary electrical circuit unit mounted adjacent the face of said circuit disk opposite said frequency determining elements, means connecting the individual frequency determining elements through said circuit disk to contacts on the opposite face thereof to cooperate with a set of corresponding contacts on said stationary electrical circuit unit, means to rotate said circuit disk and said tuning disk with respect to said circuit unit, and means to rotate said tuning disk with respect to both said circuit unit and said circuit disk.

3. A device as claimed in claim 2 characterized in that said rotatable circuit disk has a plurality of scale indicia segments fixed to its circumference, said plurality corresponding to the plurality of sets of frequency determining elements, a plurality of indicators positioned circumferentially on said tuning disk, said indicators cooperating with respective ones of said scale indicia segments, and further characterized in that an opening is provided in said housing through which one of said indicia segments and one of said indicators are simultaneously visible to thereby indicate the position of the circuit disk with respect to the stationary electrical circuit unit and to indicate the position of the tuning disk with respect to the circuit disk.

4. The tuning device in accordance with claim 1, including an indicia scale positioned circumferentially on a first one of said disks and an indicator positioned on the remaining disk and overlying said indicia scale and moving with respect to said indicia scale when said disks are rotated with respect to one another.

5. The tuning device in accordance with claim 4, in which said remaining disk extends circumferentially beyond the edge of said first disk, said indicator comprising a member extending laterally from said remaining disk and in front of the indicia scale on said first disk.

6. A high frequency electrical tuning device comprising a stationary electrical circuit unit having stationary contacts, a circuit disk rotatably mounted with its upper surface in close proximity to the lower surface of said circuit unit, a plurality of sets of frequency determining elements spirally wound in a single plane on said disk, each set comprising a plurality of spirally wound, flat frequency determining elements spaced apart along a substantially radial line of said disk, the sets of elements being angularly spaced apart, connector members electrically connected to said frequency determining elements, means to rotate said disk, said contacts being adapted to selectively engage sets of connector members depending upon the rotative position of said disk, and a tuning disk mounted on the same axis of rotation as said circuit disk and with its upper surface closely adjacent to the lower surface of said circuit disk, means to rotate said tuning disk about said axis, and a set of electrically conductive substantially triangular, flat tuning elements positioned substantially radially on said tuning disk, individual ones of said tuning elements being positioned to correspond to respective ones of said radially-positioned frequency determining elements.

7. A high frequency electrical tuning device comprising a stationary electrical circuit unit having stationary contacts, a circuit disk rotatably mounted with its upper surface in close proximity to the lower surface of said circuit unit, a plurality of sets of frequency determining elements on said disk, each set comprising a plurality of inductors, spirally wound in a single plane and spaced apart along a substantially radial line of said disk, the sets of inductors being angularly spaced apart, connector members electrically connected to said inductors, means to rotate said disk, said contacts being adapted to selectively engage sets of connector members depending upon the rotative position of said disk, and a tuning disk rotatably mounted on the same axis as said circuit disk and in closely spaced parallelism to said circuit disk, means to rotate said tuning disk about said axis, and a plurality of sets of electrically conductive substantially triangular, flat, tuning elements on said tuning disk corresponding to said sets of inductors, each said sets of tuning elements comprising a plurality of elements positioned along substantially radial lines and corresponding to the respective sets of said radially positioned inductors.

References Cited in the file of this patent

UNITED STATES PATENTS

| | | |
|---|---|---|
| 1,958,282 | Tregenza | May 8, 1934 |
| 2,468,126 | Silver | Apr. 26, 1949 |
| 2,513,392 | Aust | July 4, 1950 |
| 2,600,119 | Lazzery | June 10, 1952 |
| 2,629,860 | Chesus et al. | Feb. 24, 1953 |
| 2,643,361 | Mackey | June 23, 1953 |
| 2,668,235 | Nordby | Feb. 2, 1954 |

FOREIGN PATENTS

| | | |
|---|---|---|
| 541,150 | Germany | Jan. 9, 1932 |